(12) United States Patent
Kohler et al.

(10) Patent No.: US 6,649,449 B2
(45) Date of Patent: Nov. 18, 2003

(54) METHODS OF FORMING PHYSICAL VAPOR DEPOSITION TARGET/BACKING PLATE ASSEMBLIES

(75) Inventors: Ron D. Kohler, New Brighton, PA (US); Matthew S. Cooper, Portersville, PA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/040,020

(22) Filed: Jan. 3, 2002

(65) Prior Publication Data

US 2002/0068386 A1 Jun. 6, 2002

Related U.S. Application Data

(62) Division of application No. 09/699,899, filed on Oct. 27, 2000, now Pat. No. 6,376,281.

(51) Int. Cl.[7] .................... H01L 21/44; H01L 21/48; H01L 21/50
(52) U.S. Cl. ........................................ 438/118; 438/643
(58) Field of Search ................................ 438/108, 118, 438/123, 127, 207, 643, 685

(56) References Cited

U.S. PATENT DOCUMENTS

| | | |
|---|---|---|
| 5,282,943 A | 2/1994 | Lannutti et al. |
| 5,522,535 A | 6/1996 | Ivanov et al. |
| 5,693,203 A | 12/1997 | Ohhashi et al. |
| 5,799,860 A * | 9/1998 | Demaray et al. |
| 5,863,398 A | 1/1999 | Kardokus et al. |
| 6,071,389 A | 6/2000 | Zhang |
| 6,113,761 A | 9/2000 | Kardokus et al. |
| 6,183,686 B1 | 2/2001 | Bardus et al. |
| 6,217,721 B1 | 4/2001 | Xu et al. |

FOREIGN PATENT DOCUMENTS

| | | |
|---|---|---|
| EP | 0522369 A1 | 1/1993 |
| JP | 59036411 | 2/1984 |
| JP | 61163208 | 7/1986 |
| JP | 63225245 | 9/1988 |
| WO | WO 99/40770 | 8/1999 |

OTHER PUBLICATIONS

Anonymous: "Method of Metallizing Cermet Tiles" Jul. 1982, IBM Technical Disclosure Bulletin, vol. 25, No. 2, p. 555, New York.

* cited by examiner

*Primary Examiner*—Phuc T. Dang
(74) *Attorney, Agent, or Firm*—Wells St. John P.S.

(57) ABSTRACT

The invention encompasses PVD target/backing plate assemblies which include a PVD target having a surface, and a bonding layer on the surface. The bonding layer has a different composition than the target surface, and a backing plate is provided to be separated from the PVD target surface by at least the bonding layer. The bonding layer forms a strong diffusion bond to the target. The invention also includes methods of forming PVD target/backing plate assemblies. Additionally, the invention includes assemblies in which one or more of titanium, zirconium, and copper is incorporated into a bonding layer between a target and a backing plate in a physical vapor deposition target/backing assembly.

27 Claims, 3 Drawing Sheets

METHODS OF FORMING PHYSICAL VAPOR DEPOSITION TARGET/BACKING PLATE ASSEMBLIES

RELATED PATENT DATA

This patent is a divisional application of U.S. patent application Ser. No. 09/699,899 which was filed on Oct. 27, 2000 now U.S. Pat. No. 6,376,281.

TECHNICAL FIELD

The invention pertains to physical vapor deposition target/backing plate assemblies, and to methods of forming physical vapor deposition target/backing plate assemblies. In particular applications, the invention pertains to methods of incorporating a bonding layer between a target and a backing plate in a physical vapor deposition target/backing assembly, with an exemplary bonding layer being a layer capable of forming a strong diffusion bond to the target at a temperature of less than or equal to about 500° C. in a time of less than or equal to about 24 hours. A "strong" diffusion bond is defined as a bond capable of passing a peel test described herein. In further applications, the invention pertains to methods of incorporating one or more of titanium, zirconium, and copper in a bonding layer between a target and a backing plate in a physical vapor deposition target/backing assembly.

BACKGROUND OF THE INVENTION

Physical Vapor Deposition (PVD) targets have wide application in fabrication processes where thin films are desired, and include, for example, sputtering targets. An exemplary PVD process is a sputtering process, and an exemplary application of a PVD process is to form thin films across semiconductor substrates in semiconductor processing applications.

A prior art PVD process is diagrammatically illustrated in FIG. 1. More specifically, FIG. 1 illustrates an apparatus 10 comprising a PVD target/backing plate assembly 12 above a substrate 14. Assembly 12 comprises a sputtering target 16 joined to a backing plate 18. Target 16 can comprise any of numerous metallic elements and alloys, and backing plate 18 can comprise numerous electrically and thermally conductive materials, such as, for example, copper or aluminum.

Target 16 has a surface 20 from which material is ejected, and which can be referred to as a sputtering surface. In operation, surface 20 is exposed to ions or atoms which impact the surface and are utilized to eject material from the surface toward substrate 14. The ejected material is illustrated by arrows 22 in FIG. 1. Such ejected material lands on substrate 14 to form a thin film (not shown) over the substrate.

Backing plate 18 provides several functions during the sputtering application illustrated in FIG. 1. For instance, backing plate 18 is typically provided with a shape configured to enable assembly 12 to be removably retained within a sputtering apparatus chamber (not shown). Also, backing plate 18 is typically formed of an electrically/thermally conductive material and is utilized for passing an electric field to sputtering target 16. An interface between target 16 and backing plate 18 should preferably comprise a bond strong enough to retain target 16 to backing plate 18 during a sputtering operation, and yet also comprise a continuous, uniform and electrically conductive construction so that an electric field can be passed uniformly across the interface from backing plate 18 to target 16. Among the methodologies presently utilized for forming a target-to-backing plate interface is a methodology of providing solder (shown as 15 in FIG. 1) between a target and backing plate to bond the target to the backing plate. The solder can comprise, for example, one or both of tin and indium.

A difficulty in utilizing solders is that the solders frequently do not adhere well to a target material, and accordingly a target can separate from a backing plate if only solder is utilized in the backing plate/target bond. Such problem can be particularly pronounced with targets comprising one or more of tantalum, cobalt, zirconium, platinum, iron, niobium, molybdenum, chromium, aluminum, copper and manganese. In order to overcome such difficulty, a transition layer 19 is frequently provided over a target surface prior to bonding the target surface to a backing plate. In the shown target/backing plate construction, target 16 has a surface 17 which is ultimately to be utilized in forming a bond with backing plate 18. Transition layer 19 is formed over surface 17 prior to bonding the target with the backing plate.

Transition layer 19 typically comprises nickel. The nickel is considered to adhere better to various target materials than does an indium or tin-based solder, and in turn an indium or tin-based solder is considered to adhere better to the nickel than to the target material. Accordingly, the nickel layer 19 can be ultimately bonded with solder 15 to retain the target 16 to backing plate 18.

Nickel-containing transition layers improve adhesion of various target materials to backing plates. However, it is found that even when such layers are provided, problems can still be encountered with separation or delamination of a PVD target from a target/backing plate assembly during a sputtering process. Nickel-containing transition layers can be particularly unsatisfactory when utilized with target compositions comprising one or more of Ta, Co, Zr, Pt, Fe, Nb, Mn, Cr, Al, Cu. The separation of a target and backing plate can occur, for example, at an interface between the nickel transition layer and the target. If delamination exceeds more than about 5% of the area of a target surface, the target/backing plate assembly can be rendered inoperable in that it will not perform within desired parameters. In some instances, a delamination of greater than or equal to about 1% can render a target/backing plate assembly inoperable. It would, accordingly, be desirable to develop new methodologies for adhering targets to backing plates to avoid the delamination problems associated with nickel transition layers.

SUMMARY OF THE INVENTION

In one aspect, the invention comprises a PVD target/backing plate assembly. The assembly includes a PVD target having a surface, and a bonding layer on the surface. The bonding layer has a different composition than the target surface, and a backing plate is provided to be separated from the PVD target surface by at least the bonding layer. The bonding layer can comprise a material capable of forming a strong diffusion bond to the target in less than or equal to about 24 hours at a temperature of less than or equal to about 500° C., and can comprise, for example, one or more of copper, titanium and zirconium. In particular embodiments, the bonding layer can consist of, or consist essentially of, one or more of copper, titanium and zirconium. A "strong" diffusion bond is defined as a bond capable of passing a peel test described herein.

In another aspect, the invention includes a method of forming a PVD target/backing plate assembly. A bonding layer is formed on a surface of a PVD target, and a backing plate is joined to the bonding layer. Accordingly, the backing plate is separated from the PVD target surface by at least the bonding layer. The bonding layer can comprise, for example, one or more of copper, titanium and zirconium.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

The invention encompasses new methods of forming target/backing plate assemblies, and also encompasses target/backing plate assemblies which can be formed by the methods. Methodology of the present invention can be utilized with numerous metallic PVD target compositions, including, for example, compositions comprising one or more transition metals, as well as compositions comprising one or more of Tl and Al. Methodology of the present invention can have particular applicability to PVD targets comprising one or more of tantalum, cobalt, zirconium, platinum, iron, niobium, manganese, chromium, aluminum and copper; as such compositions can cause particular difficulties with respect to prior art methodologies described in the "Background" section of this disclosure which can be overcome with methodology of the present invention. Further, methodology of the present invention can be particularly applicable for PVD targets which consist essentially of, or consist of, Ta, Co, CoTaZr, CoPt, Pt, FeTa, TiZr, CoNb, Mo, CoCrPt, Al, AlCuFe, FeMn and FeAl. It is to be understood that the listed complexes, such as, for example, CoTaZr, are described in terms of the components of the complexes, rather than stoichiometries. For instance, numerous complexes consisting of, or consisting essentially of, CoTaZr in various stoichiometric relationships can exist, and the nomenclature "CoTaZr" is intended to encompass all of such complexes.

Figure 2:
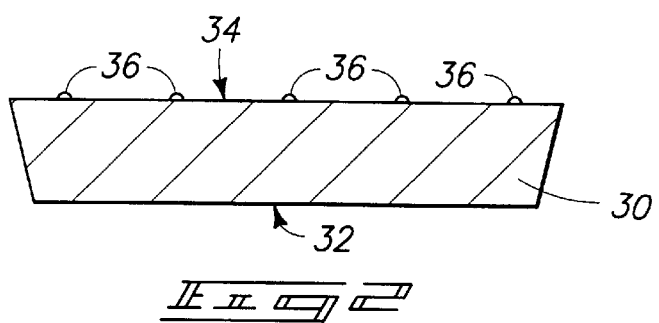
FIG. 2 is a diagrammatic, cross-sectional view of a PVD target at a preliminary processing step of a method of the present invention.

An exemplary method of the present invention is described with reference to FIGS. 2–7. Referring initially to FIG. 2, a PVD target 30 is illustrated in cross-sectional view. Target 30 comprises a sputtering surface 32 and a back surface 34 in opposing relation to sputtering surface 32. Back surface 34 is shown to comprise surface anomalies 36 which can correspond to, for example, burrs, contaminants, or other aspects of surface roughness. Features 36 are shown at an exaggerated scale relative to target 30 to enable illustration of features 36. It is to be understood that features 36 would normally be much smaller in relation to target 30 than shown.

Figure 3:
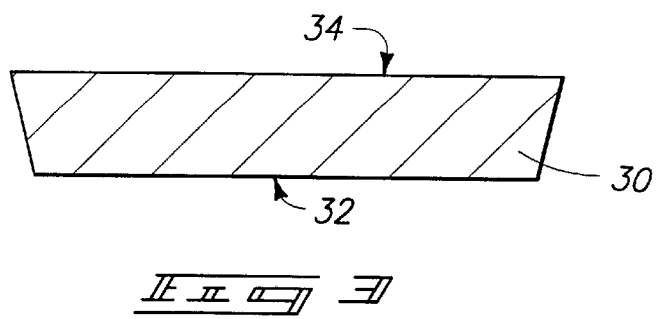
FIG. 3 is a view of the FIG. 2 target shown at a processing step subsequent to that of FIG. 2.

FIG. 3 illustrates target 30 after surface 34 has been subjected to a cleaning procedure. An exemplary cleaning procedure comprises first cleaning the surface with a solvent to remove debris from the surface, and subsequently exposing the surface to a plasma etch to remove burrs or other non-desired surface features, and accordingly smooth surface 34. A solvent is preferably chosen which is substantially inert relative to reaction with the material of target 30 to avoid oxidation and/or corrosion of target 30 at surface 34, with an exemplary solvent being an organic solvent, such as, isopropyl alcohol. A suitable plasma etch can be conducted with an argon plasma at 1200 volts for a time of about 20 minutes. The etch is preferably conducted at a sub-atmospheric pressure, such as, for example, a pressure of about $10^{-6}$ torr.

Figure 4:
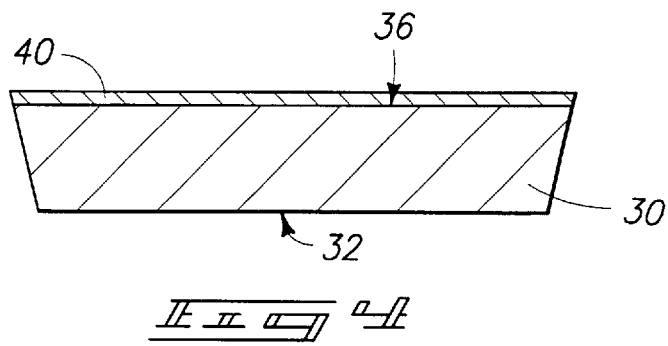
FIG. 4 is a view of the FIG. 2 target shown at a processing step subsequent to that of FIG. 3.

Referring to FIG. 4, a bonding layer 40 is provided on surface 36 of target 30. Bonding layer 40 can comprise, for example, one or more of titanium, copper, and zirconium; and in particular embodiments can consist essentially of, or consist of, one or more of titanium, zirconium or copper. Bonding layer 40 can ultimately form a strong bond to target 30, and can, for example, be a layer capable of forming a strong diffusion bond to the target in less than or equal to about 24 hours at a temperature of less than or equal to about 500° C. A "strong" diffusion bond is defined as a bond capable of passing a peel test described herein.

In an exemplary embodiment, layer 40 comprises titanium. Such exemplary embodiment is described below by referring to layer 40 as a titanium-comprising layer 40. It is to be understood, however, that the invention can be utilized with other materials besides a referred-to titanium-comprising layer, and that the described processing can also be utilized in conjunction with, for example, a zirconium-comprising layer 40 or a copper-comprising layer 40.

With reference to the exemplary embodiment in which layer 40 comprises titanium, the titanium-comprising layer 40 can have titanium as a majority element (with the term "majority element" indicating that titanium is present in a higher concentration than in any other element, and can include, for example, a material having 30 weight % titanium, provided, that no other element is present to a concentration of greater than or equal to 30 weight %), can consist essentially of titanium, or can consist of titanium. If layer 40 and target 30 both comprise titanium, layer 40 can comprise a different composition of titanium than does target 30.

An exemplary process of forming layer 40 is ion deposition. Specifically, target 30 can be placed in a vacuum chamber at a sub-atmospheric pressure, such as, for example, a pressure of $10^{-6}$ torr, and provided with either a positive or negative charge. If layer 40 is to comprise titanium, a titanium substrate can be provided with an opposite charge to that of target 30 and exposed to an electron beam gun. Titanium will then vaporize from the substrate and impact the target. Ion deposition processes are known in the art. Ion deposition is an exemplary process for forming titanium layer 40, and is but one of several technologies that can be utilized for forming titanium layer 40. Another process that can be utilized for forming layer 40 is electroplating.

One aspect of an ion deposition process can be that coating materials driven by the process can actually penetrate a short distance into surface 36 of target 30, as well as forming coating 40 over surface 36. Coating 40 can be formed to a thickness of, for example, from about 2,000 angstroms to about 4,000 angstroms, with an exemplary thickness being about 3,000 angstroms. At some time during or after formation of coating 40, the material of coating 40 can be diffusion bonded to target 30. Such diffusion bonding preferably occurs at a temperature of less than 500° C. (such as, for example, a temperature of less than or equal to 200° C.), for a time of less than or equal to 24 hours (such as, for example, a time of a few hours). The diffusion bonding preferably forms a strong bond, with "strong" being defined as a bond that passes a peel test described herein.

If ion deposition is used to form layer 40, the diffusion bonding can occur during the ion deposition. It can be advantageous to have diffusion bonding occurring during a deposition process, as such can save processing steps relative to embodiments in which diffusion bonding occurs in a separate step from a deposition process.

Since the plasma cleaning (described with reference to FIG. 3) and the titanium coating (described with reference to FIG. 4) can both be conducted at sub-atmospheric pressure, target 30 can be maintained under sub-atmospheric pressure conditions from the time that the plasma cleaning step is initiated until the ion deposition is complete.

Figure 5:
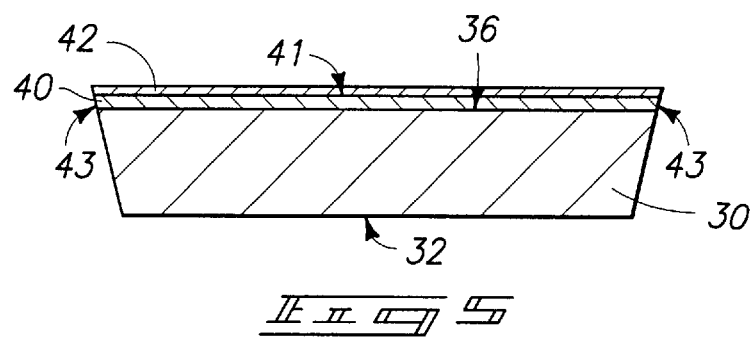
FIG. 5 is a view of the FIG. 2 target shown at a processing step subsequent to that of FIG. 4.

If material 40 comprises a readily-oxidized material (such as titanium), it can be desired to form a protective (or passivating) layer over material 40 to alleviate oxidation of the material of layer 40. FIG. 5 illustrates formation of a passivating layer 42 over layer 40. Passivating layer 42 can comprise, for example, nickel, and can be formed by, for example, ion deposition of nickel. In the shown embodiment, layer 40 comprises an upper surface 41 and sidewall surfaces 43; and passivating layer 42 is formed only over upper surface 41. It is to be understood, however, that the invention encompasses other embodiments wherein passivating layer 42 is also formed over sidewall surfaces 43. Passivating layer 42 is preferably at least 1200 angstroms thick, and can be, for example, at least 1500 angstroms thick.

In embodiments in which passivating layer 42 is formed by ion deposition, the passivating layer can be formed at a sub-atmospheric pressure, such as, for example, a pressure of $10^{-6}$ torr. Accordingly, target 34 can remain under a sub-atmospheric pressure from a time of initiation of the plasma cleaning step (described with reference to FIG. 3) until after formation of passivating layer 42. Such can reduce exposure of target 30 to atmosphere-borne contaminants.

Figure 6:
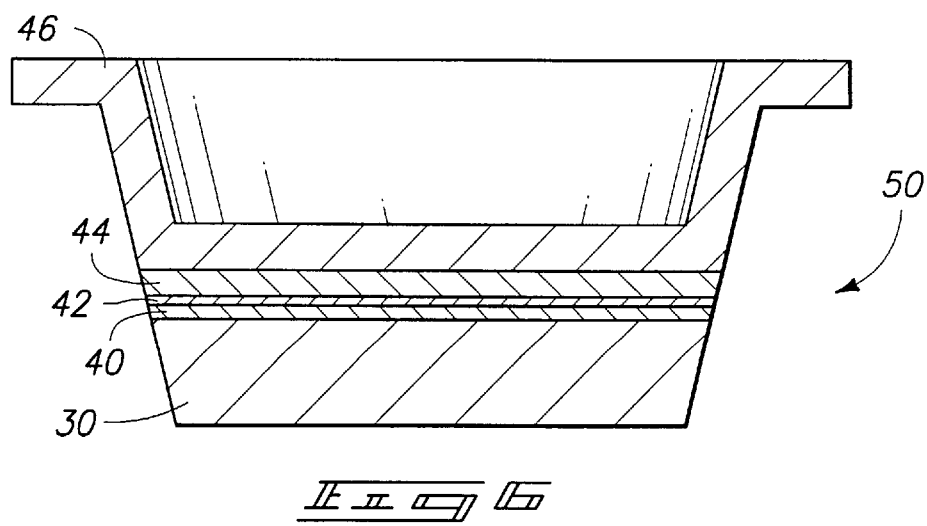
FIG. 6 is a view of the FIG. 2 targets shown at a processing step subsequent to that of FIG. 5, and shown in a PVD target/backing plate assembly.

Referring to FIG. 6, a layer of solder 44 is provided over passivating layer 42. Solder layer 44 can comprise, for example, one or both of tin and indium. A backing plate 46 is provided against solder 44, and bonded through solder 44 to the assembly comprising target 30, and layers 40 and 42. Backing plate 46 can comprise, for example, copper. Solder 44 can be formed to, for example, a thickness of at least about 10,000 Å. An exemplary method of forming solder 44 comprises applying a first portion of solder to nickel layer 44, and subsequently heating the nickel to about 200° C. Subsequently, a second portion of solder is applied on the first portion, and the two portions of solder are pressed between backing plate 46 and target 30 in assembly 50. The solder is in a softened or heated form during the pressing of the solder within assembly 50. The assembly is clamped together, and allowed to cool for 4 to 5 hours to achieve a solder bond holding backing plate 46 to layer 42. Such bond can alternatively be referred to as a bond in which backing plate 46 is held to target 30 through solder layer 44, passivating layer 42, and bonding layer 40. The assembly 50 of FIG. 6 can be referred to as a PVD target/backing plate assembly.

Assembly 50 differs from the prior art target/backing plate assembly 12 (FIG. 1), in that assembly 50 comprises a titanium-comprising layer 40 (or another bonding layer 40 encompassed by the present invention) in place of nickel-comprising transition layer 19 of the prior art assembly. Assembly 50 can alternatively be considered as comprising a backing plate 46 separated from a target 30 by at least bonding layer 40. In the shown embodiment, backing plate 46 is actually separated from target 30 by not only bonding layer 40, but also by solder layer 44 and passivating layer 42. However, it is to be understood that the invention encompasses other embodiments (not shown) wherein one or both of layers 44 and 42 can be eliminated. For instance, bonding layer 40 can be bonded directly to backing plate 46 utilizing diffusion-bonding methodologies.

Bonding layer 40 is distinct from target 30 in that bonding layer 40 comprises a different composition than target 30. Bonding layer 40 can have a different composition than target 30 if it comprises overlapping materials with target 30, but in different concentrations than target 30; or if it comprises different materials than target 30. An advantage of methodology of the present invention is that it can form strong diffusion bonds between bonding layer 40 and target 30, even if layer 40 and target 30 do not comprise a common majority element. For instance, bonding layer 40 can predominately comprise copper in applications wherein target 30 does not comprise copper. As another example, layer 40 can predominately comprise titanium in applications wherein target 30 does not comprise titanium. As yet another example, layer 40 can predominately comprise zirconium in applications wherein target 30 does not comprise zirconium.

Figure 1:
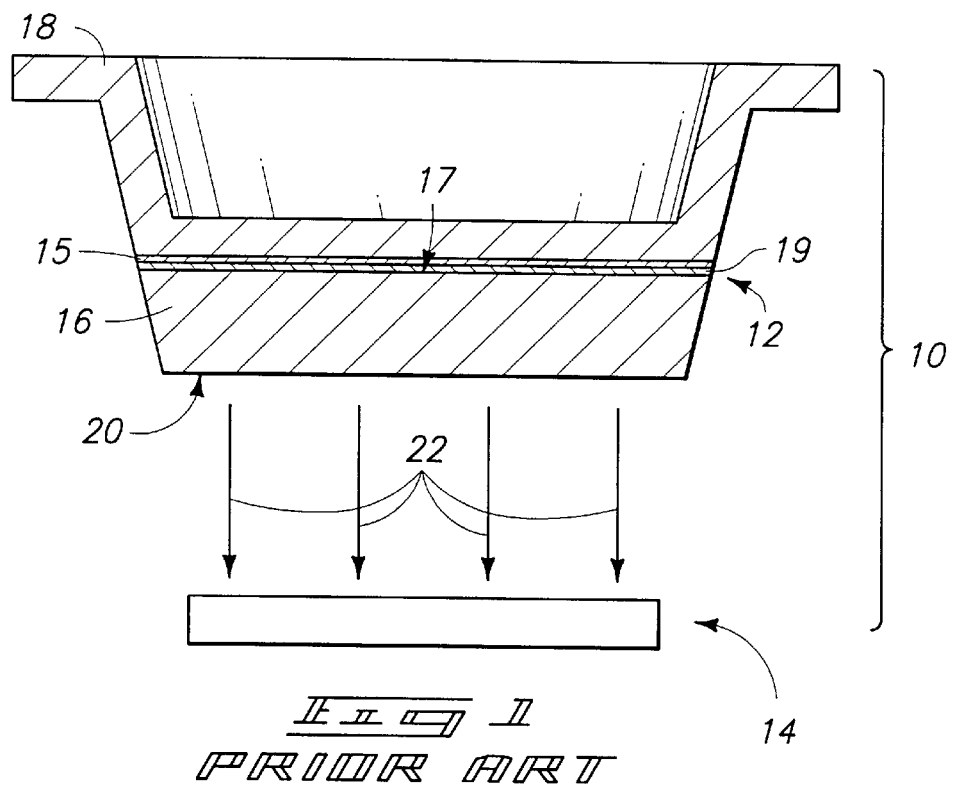
FIG. 1 is a diagrammatic, cross-sectional view of a portion of a prior art PVD apparatus.

An alternative view of assembly 50, in constructions in which passivating layer 42 comprises nickel, is that assembly 50 can be considered to comprise the nickel-comprising transition layer of the prior assembly 12 of FIG. 1, but to comprise such layer as a nickel-comprising layer 42 separated from target 30 by bonding layer 40.

An advantage of utilizing titanium, zirconium and/or copper in bonding layers of the present invention is that such materials can be compatible for forming strong bonding interactions with numerous metals and alloys, including transition metals, thallium and aluminum. For instance, titanium can be compatible with the metals and alloys relative to, for example, thermal expansion. In peel tests, a layer 40 of titanium has been found to have excellent adhesion to a target 30. To perform the peel test, a 15 millimeter wide strip of Nichiban™ Clear Tape was manually pressed on solder 44 along a diameter of target plate 30 in a construction which included solder 44, a nickel-comprising passivating layer 42, titanium-comprising layer 40 and a target 30 comprising cobalt/tantalum/zirconium, with such construction not yet being bonded to a backing plate. The tape was then peeled from the solder layer, and the amount that adhered to the tape was observed. The test was repeated by applying a second strip of tape along a diameter oriented 90° to the diameter where the first test was performed. Examination of the strips of tape revealed that none of the material from either the solder layer 44, nickel-comprising layer 42, titanium-comprising layer 40 or target 30 had adhered to the tape, indicating excellent adhesion between titanium layer 40 and target 30. A bonding layer is defined to form a "strong" bond to a target if the bonding layer can pass the above-described peel test. In other words, if the bonding layer adheres sufficiently to the target that none of the bonding layer is lifted from the target by Nichiban™ Clear Tape that is applied and lifted from two perpendicular directions across a surface of the bonding layer. The tape can be applied directly to the bonding layer, or to one or more layers adhered over the bonding layer. Preferably, the tape is applied directly to the bonding layer. If the tape is applied to one or more layers adhered over the bonding layer, the test can be inconclusive if the one or more layers separate from one another, rather than allowing sufficient stress to be imparted to the bonding layer to determine if the bonding layer will separate from the target.

Although target constructions comprising any of numerous elements and compositions can be utilized in methodology of the present invention, some elements and compositions can be less preferred than others due to, for example, some elements and compositions forming weaker bonds with bonding layer 40 than other elements and compositions. For instance, targets comprising indium-tin-oxide (ITO) can be less preferred than other targets for utilization in methodology of the present invention.

Figure 7:
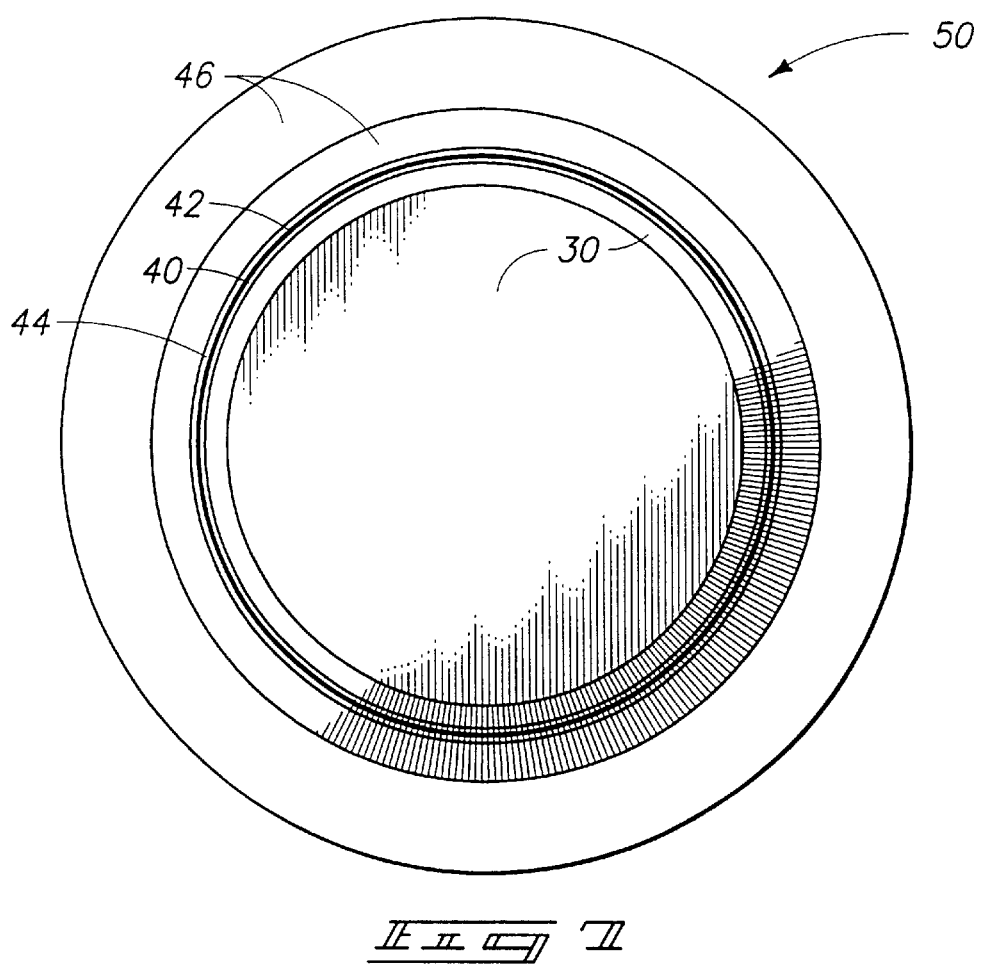
FIG. 7 is a top view of the assembly of FIG. 6.

FIG. 7 is a top view of the FIG. 6 assembly 50, and illustrates that assembly 50 can, in particular embodiments, comprise a round outer peripheral shape. It is noted that FIGS. 2–7 are exemplary embodiments of the present invention only, and that other shapes of backing plates and targets can be utilized in methodology of the present invention besides the shapes specifically shown.

Although various aspects of the invention are described above with reference to the exemplary embodiment in which layer 40 comprises titanium, it is to be understood that similar processing can be utilized if bonding layer 40 comprises other materials such as, for example, zirconium or copper. If layer 40 comprises zirconium, the layer can have zirconium as a majority element, can consist essentially of zirconium, or can consist of zirconium. If layer 40 comprises copper, the layer can have copper as a majority element, can consist essentially of copper, or can consist of copper.

What is claimed is:

1. A method of forming a PVD target/backing plate assembly, comprising:
   forming a bonding layer on a surface of the PVD target and forming a strong diffusion bond between the bonding layer and the target in less than or equal to about 24 hours at a temperature of less than or equal to about 500° C.; the forming the bonding layer comprising coating the bonding layer onto the surface by ion deposition; the strong diffusion bond forming during the ion deposition;
   forming a passivating layer on the bonding layer;
   forming a layer of solder on the passivating layer; and
   joining a backing plate to the target, the joining the backing plate to the target comprising bonding the backing plate with the solder, the backing plate being joined through a connection that includes at least the bonding layer and accordingly being separated from the PVD target surface by at least the bonding layer.

2. The method of claim 1 further comprising exposing the surface of the PVD target to a plasma etch before forming the bonding layer.

3. The method of claim 2 wherein the PVD target remains exposed to a sub-atmospheric pressure from the exposing of the target to a plasma etch until the forming the layer of solder.

4. The method of claim 3 wherein the passivating layer comprises nickel.

5. The method of claim 1 wherein titanium is a majority element of the bonding layer.

6. The method of claim 1 wherein the bonding layer consists essentially of titanium.

7. The method of claim 1 wherein zirconium is a majority element of the bonding layer.

8. The method of claim 1 wherein the bonding layer consists essentially of zirconium.

9. The method of claim 1 wherein copper is a majority element of the bonding layer.

10. The method of claim 1 wherein the bonding layer consists essentially of copper.

11. The method of claim 1 wherein the PVD target comprises at least one transition metal.

12. The method of claim 1 wherein the PVD target comprises one or more of Tl, Ta, Co, Zr, Pt, Fe, Nb, Mn, Cr, Al, Cu.

13. The method of claim 1 wherein the PVD target consists essentially of Ta, Co, CoTaZr, CoPt, Pt, FeTa, TiZr, CoNb, Mo, CoCrPt, Al, AlCuFe, FeMn or FeAl; wherein the complexes are described in terms of components rather than stoichiometries.

14. A method of forming a PVD target/backing plate assembly, comprising:
   forming a bonding layer on a surface of the PVD target, the bonding layer comprising one or both of zirconium and titanium; and
   joining a backing plate to the target; the backing plate being joined through a connection that includes at least the bonding layer and accordingly being separated from the PVD target surface by at least the bonding layer.

15. The method of claim 14 wherein the forming the bonding layer comprises coating the bonding layer onto the surface by ion deposition.

16. The method of claim 14 further comprising exposing the surface of the PVD target to a plasma etch before forming the bonding layer; wherein the forming the bonding layer comprises coating the bonding layer onto the surface by ion deposition; and wherein the PVD target remains exposed to a sub-atmospheric pressure during the exposing and coating.

17. The method of claim 16 further comprising:
   forming a passivating layer on the bonding layer;
   forming a layer of solder on the passivating layer; and wherein
      the joining the backing plate to the target comprises bonding the backing plate with the solder; and
      the PVD target remains exposed to a sub-atmospheric pressure from the exposing of the target to a plasma etch through at least until the step of forming the layer of solder.

18. The method of claim 17 wherein the passivating layer comprises nickel.

19. The method of claim 14 wherein the forming the bonding layer comprises coating the bonding layer onto the surface by ion deposition; the method further comprising, before the forming the bonding layer:
   cleaning the surface with an organic solvent; and
   exposing the cleaned surface to a plasma etch.

20. The method of claim 14 wherein titanium is a majority element of the bonding layer.

21. The method of claim 14 wherein the bonding layer consists essentially of titanium.

22. The method of claim 14 wherein zirconium is a majority element of the bonding layer.

23. The method of claim 14 wherein the bonding layer consists essentially of zirconium.

24. The method of claim 14 further comprising:
   forming a passivating layer on the bonding layer;
   forming a layer of solder on the passivating layer; and wherein the joining the backing plate to the target comprises bonding the backing plate with the solder.

25. The method of claim 14 wherein the PVD target comprises at least one transition metal.

26. The method of claim 14 wherein the PVD target comprises one or more of Tl, Ta, Co, Zr, Pt, Fe, Nb, Mn, Cr, Al, Cu.

27. The method of claim 14 wherein the PVD target consists essentially of Ta, Co, CoTaZr, CoPt, Pt, FeTa, TiZr, CoNb, Mo, CoCrPt, Al, AlCuFe, FeMn or FeAl; wherein the complexes are described in terms of components rather than stoichiometries.

* * * * *